(12) United States Patent
Paul et al.

(10) Patent No.: US 11,646,662 B2
(45) Date of Patent: May 9, 2023

(54) REFERENCE BUFFER

(71) Applicant: Texas Instruments Incorporated, Dallas, TX (US)

(72) Inventors: Sabu Paul, Bengaluru (IN); Raghu Nandan Srinivasa, Benglauru (IN); Srinivas Bangalore Seshadri, Bengaluriu (IN); Saugata Dutta, Kolkata (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 202 days.

(21) Appl. No.: 17/245,940

(22) Filed: Apr. 30, 2021

(65) Prior Publication Data
US 2022/0352820 A1 Nov. 3, 2022

(51) Int. Cl.
| | |
|---|---|
| H03M 1/12 | (2006.01) |
| H02M 3/158 | (2006.01) |
| H03M 1/00 | (2006.01) |
| H03M 1/74 | (2006.01) |
| H03K 19/17764 | (2020.01) |
| H03K 19/173 | (2006.01) |

(52) U.S. Cl.
CPC .......... *H02M 3/158* (2013.01); *H03M 1/001* (2013.01); *H03M 1/74* (2013.01); *H03K 19/173* (2013.01); *H03K 19/17764* (2013.01)

(58) Field of Classification Search
CPC ........ H02M 3/158; H03M 1/001; H03M 1/74; H03K 19/17764; H03K 19/173
See application file for complete search history.

(56) References Cited

U.S. PATENT DOCUMENTS

| | | | |
|---|---|---|---|
| 6,747,589 B2 | 6/2004 | Srinivasan et al. | |
| 7,746,129 B2 | 6/2010 | Choi et al. | |
| 9,501,073 B2 | 11/2016 | Petrov | |
| 2013/0135905 A1 | 5/2013 | Yeh | |
| 2022/0149864 A1* | 5/2022 | Prakash | ................... H03M 3/32 |

OTHER PUBLICATIONS

International Application No. PCT/US2022/026627, "Annex to Form PCT/ISA/206, Communication Relating to the Results of the Partial International Search Report", dated Aug. 8, 2022, 14 pgs.
International Search Report, PCT Application No. PCT/US2022/026627, dated Sep. 30, 2022, 6 pgs.

* cited by examiner

*Primary Examiner* — Joseph J Lauture
(74) *Attorney, Agent, or Firm* — John R. Pessetto; Frank D. Cimino (57) ABSTRACT

A reference voltage generator comprises a comparator, a digital-to-analog converter (DAC) and a switched capacitor accumulator. The comparator receives a reference voltage input, a feedback input, and a control signal. The DAC is coupled to an output of the comparator, and the switched capacitor accumulator is coupled to an output of the DAC. In some implementations, a digital filter is coupled between the output of the comparator and the input of the DAC. The switched capacitor accumulator can be coupled to a buffer that outputs the feedback input and a reference voltage for an analog-to-digital converter (ADC). In some implementations, the feedback loop includes N one-bit DACs coupled to the output of the comparator and N switched capacitor accumulators, each of which is coupled to a unique one-bit DAC.

24 Claims, 8 Drawing Sheets

REFERENCE BUFFER

BACKGROUND

Successive approximation register (SAR) analog-to-digital converters (ADCs) are common in multi-channel data acquisition systems, such as ultrasound and other medical imaging systems, manufacturing inspection and quality control systems, and temperature and stress sensing systems, among others. In an SAR ADC, a reference voltage output by a buffer is used to charge capacitors during a HOLD or CONVERT phase, which can cause the reference voltage to dip rather than maintain a constant value. Some reference buffers include an error amplifier and a capacitor to help correct for the dips in the reference voltage and to help maintain the level or DC reference voltage with the desired accuracy. However, the error amplifier and capacitor occupy a large area of the integrated circuit and consume large amounts of power. In addition, the error amplifier adjusts the level or DC value of the reference voltage based on the time average value of the reference voltage, which includes transient dips. Because the transient dips contain signal and harmonic content, the error amplifier's adjustments to the level or DC value of the reference voltage based on the time average value of the reference voltage can introduce fundamental and harmonic errors into the ADC output.

SUMMARY

A feedback loop comprises a comparator, a digital-to-analog converter (DAC), and a switched capacitor accumulator. The comparator has a first input for a reference voltage input, a second input for a feedback input, and a third input for a control signal. The DAC is coupled to an output of the comparator, and the switched capacitor accumulator is coupled to an output of the DAC. In some implementations, a digital filter is coupled between the output of the comparator and an input of the DAC. In some examples, the feedback loop is coupled to a buffer that is configured to output the feedback input and a reference voltage for an analog-to-digital converter (ADC).

In some examples, multiple feedback loops share a common comparator. A first feedback loop receives a second control signal, and a second feedback loop receives a third control signal. A buffer is coupled to an output of the first feedback loop. A selector logic circuit receives the reference voltage input and an output of the buffer and outputs the feedback input. A control input of the selector logic circuit receives the second control signal. The second feedback loop outputs an offset correction signal for the comparator.

In some implementations in which multiple feedback loops share a common comparator, a first feedback loop receives a first clock signal and a second feedback loop receives a second clock signal. A first buffer coupled to an output of the first feedback loop outputs a first reference voltage output, and a second buffer coupled to an output of the second feedback loop outputs a second reference voltage output. A selector logic circuit receives the first and second reference voltage outputs and outputs the feedback input. A control input of the selector logic circuit receives the first clock signal.

BRIEF DESCRIPTION OF THE DRAWINGS

For a detailed description of various examples, reference will now be made to the accompanying drawings in which.

The same reference numerals are used in the drawings to designate the same or similar (by function and/or structure) features.

DETAILED DESCRIPTION

The disclosed digital feedback loops include a comparator, a one-bit digital-to-analog converter (DAC), and a switched capacitor accumulator. The circuitry of some example embodiments occupy less area and consume less power than conventional analog error amplifiers and capacitors. In addition, because the feedback loop is digital rather than analog, the feedback loop adjusts the reference voltage output based on the settled value of the reference voltage rather than the time average value of the reference voltage. In some examples, the digital feedback loop also includes a digital filter to reduce noise from the comparator and biasing voltages to improve the direct current (DC) gain.

Figure 1A:
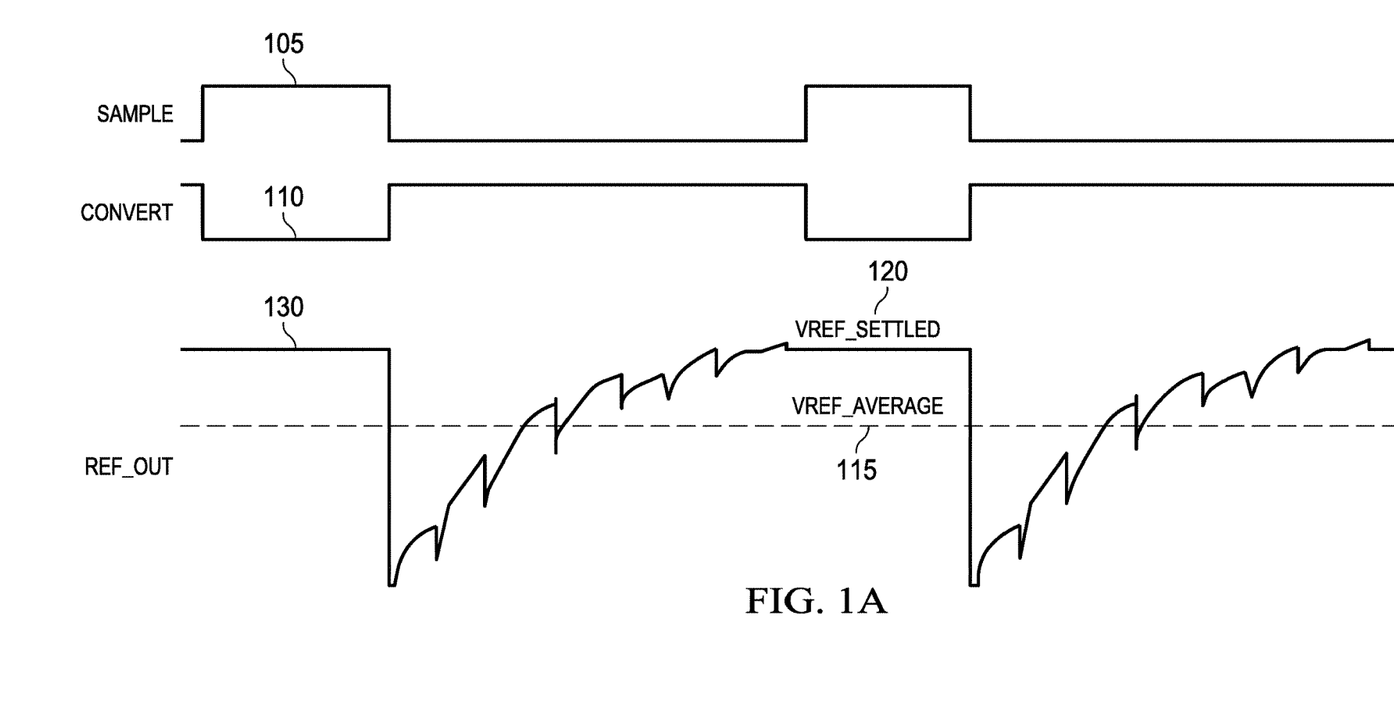
FIG. 1A illustrates a graph of SAMPLE and CONVERT control signals in an analog-to-digital converter (ADC) and a reference voltage provided to the ADC.

FIG. 1A illustrates a graph of SAMPLE and CONVERT control signals in an analog-to-digital converter (ADC) and a reference voltage provided to the ADC. The control signal SAMPLE 105 and the control signal CONVERT 110 are inverted relative to one another. In a successive approximation register (SAR) ADC, the reference buffer output REF_OUT 130 charges capacitors during the CONVERT phase, which can cause REF_OUT 130 to dip rather than maintain a constant value.

Some conventional reference buffers maintain the time average VREF_AVERAGE 115 of REF_OUT 130 to be approximately equal to the input reference voltage. The settled value VREF_SETTLED 120 of REF_OUT 130 is not equal to the input reference voltage and includes signal and harmonic content that causes the SAR ADC to have signal gain errors and harmonic errors. Additional SAR comparison cycles, referred to as dynamic error correction cycles, can be inserted during the CONVERT phase to reduce the impact of transient dips in REF_OUT 130. Dynamic error correction cycles allow the reference voltage generator for the ADC to set the settled value VREF_SETTLED 120, rather than the time average VREF_AVERAGE 115, equal to the input reference voltage.

Figure 1B:
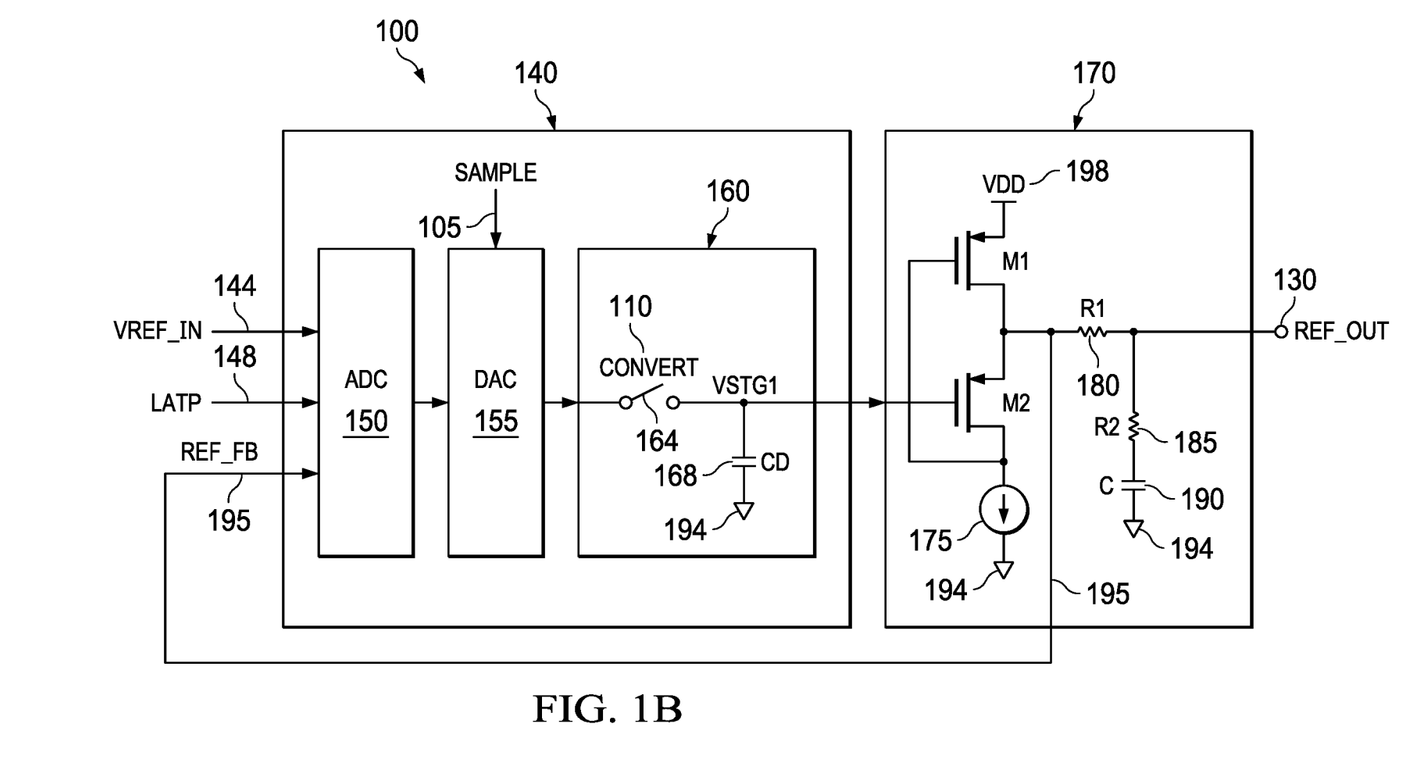
FIG. 1B illustrates an example reference voltage generator configured to provide the reference voltage shown in FIG. 1A.

FIG. 1B illustrates a reference voltage generator 100 with a digital feedback loop 140 that corrects for errors in VREF_SETTLED 120 rather than VREF_AVERAGE 115. For ease of illustration, reference voltage generator 100 is described herein with reference to FIG. 1A and includes the low-bandwidth, high gain digital feedback loop 140 and a buffer stage 170. The digital feedback loop 140 has a smaller area (e.g. an area on a semiconductor substrate) than an analog feedback loop with a high gain amplifier and a capacitor. In some example embodiments, feedback loop 140 is implemented with an ADC 150, a DAC 155, and a switched capacitor accumulator 160. Buffer stage 170 is a high bandwidth buffer stage for fast settling and implemented with a flipped voltage follower in this example, but any appropriate buffer stage may be used.

The ADC 150 in digital feedback loop 140 can be any appropriate type of ADC or multi-bit digitizer, and receives the reference voltage input VREF_IN 144, a clock input LATP 148, and a reference feedback signal REF_FB 195. The output of ADC 150 is provided to DAC 155, which also receives SAMPLE 105. The analog output of DAC 155 is provided to the switched capacitor accumulator 160, which includes a switch 164 and an accumulating capacitor CD 168. One terminal of the switch 164 is coupled to the input of switched capacitor accumulator 160, and switch 164 is controlled by CONVERT 110. Capacitor CD 168 is coupled between the other terminal of switch 164 and a common potential (e.g. ground) 194. The voltage VSTG1 is the output of the digital feedback loop 140 integrated over CD 168, and provided to an input of buffer stage 170.

Buffer stage 170 is a flipped voltage follower in this example, and includes transistors M1-M2, a current source 175, two resistors 180 and 185 having a resistance R1 and R2, respectively, and a capacitor 190 having a capacitance C. The transistors M1-M2 are metal oxide semiconductor field-effect transistors (MOSFETs). M1-M2 are p-type MOSFETs (PMOS) in this example. In other examples, one or more of M1-M2 are n-type MOSFETs (NMOS) or bipolar junction transistors (BJTs). A BJT includes a base corresponding to the gate terminal, and a collector and an emitter corresponding to the drain and source terminals of a MOSFET. The base of a BJT and the gate terminal of a MOSFET are also called control inputs. The collector and emitter of a BJT and the drain and source terminals of a MOSFET are also called current terminals.

A source terminal of M1 is coupled to a supply voltage rail VDD 198 (e.g., 5 volts), and a drain terminal of M1 is coupled to a source terminal of M2. A drain terminal of M2 and a gate terminal of M1 is coupled to an input of the current source 175, which is further coupled to ground 194. A gate terminal of M2 is coupled to the output of digital feedback loop 140. Resistor 180 has a first terminal coupled to the drain terminal of M1 and the source terminal of M2 and a second terminal coupled to an output of the buffer stage 170 configured to provide the reference voltage REF_OUT 130.

Resistor 185 has a first terminal coupled to the output of the buffer stage 170 and the second terminal of resistor 180 and a second terminal coupled to a first terminal of the capacitor 190. A second terminal of capacitor 190 is coupled to ground 194. The reference feedback signal REF_FB 195 is output from between the drain terminal of M1 and the source terminal of M2 to ADC 150, and the reference voltage output REF_OUT 130 is output from buffer stage 170 to the ADC.

M1 and M2 act as analog amplifiers and cause the voltage at the first terminal of resistor 180 to be approximately equal to the voltage VSTG1 plus a threshold voltage of M2. A voltage across current source 175 causes M1 to act as a closed switch, and current flows through M1 and across resistors 180 and 185 and capacitor 190 to generate the output reference voltage REF_OUT 130 from buffer stage 170. In response to the voltage VSTG1 being greater than a threshold voltage Vth of M2, M2 acts as a closed switch. While M2 acts as a closed switch, current through M1 flows through M2 and current source 175 as well as through the resistors 180 and 185 and capacitor 190, changing the value of the output reference voltage REF_OUT 130 to be equal to the input reference voltage VREF_IN 144.

Figure 2A:
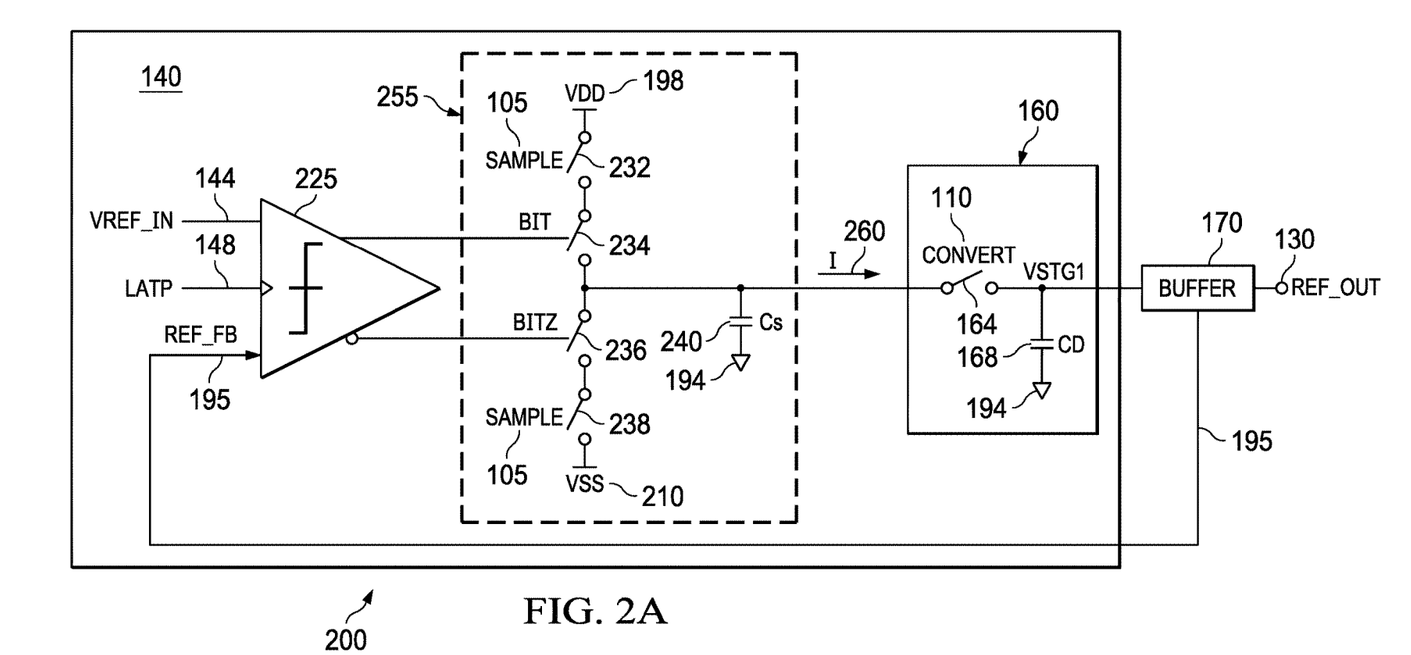
FIG. 2A illustrates a reference voltage generator with a one-bit digital feedback loop.

FIG. 2A illustrates a reference voltage generator 200 with a one-bit digital feedback loop. For ease of illustration, reference voltage generator 200 is described herein with reference to FIGS. 1A and 1B and includes a comparator 225, a one-bit DAC 255 and the switched capacitor accumulator 160. The DAC 255 is a one-bit DAC in this example embodiment, but any appropriate number N of bits N-bit DAC can be used. A one-bit DAC reduces the power consumption and area used by the DAC 255 relative to larger values of N-bit DACs. In addition, a one-bit DAC allows the ADC 150 shown in FIG. 1B to be implemented with a comparator 225. The comparator 225 receives the reference voltage input VREF_IN 144, a clock input LATP 148, and a reference feedback signal REF_FB 195. Comparator 225 outputs a first output BIT and an inverted output BITZ to DAC 255.

The one-bit DAC 255 includes four switches 232, 234, 236, and 238 and a sampling capacitor Cs 240. Switch 232 is coupled to a supply voltage rail configured to receive a supply voltage VDD 198 (e.g. 5 volts) and controlled by SAMPLE 105. Switch 234 is coupled to switch 232 and controlled by the first output BIT of comparator 225. Switch 236 is coupled to switch 234 and controlled by the inverted output BITZ of comparator 225. Switch 238 is coupled to switch 236 and to a supply voltage rail configured to receive a supply voltage VSS 210 (e.g. −5 volts). Switch 238 is controlled by SAMPLE 105. Cs 240 is coupled between switches 234 and 236 and to a common potential (e.g. ground) 194. The switched capacitor accumulator 160 is coupled to an output of the one-bit DAC 255 and to an input of buffer stage 170. Buffer stage 170 outputs the reference feedback signal REF_FB 195 and the output reference voltage REF_OUT 130.

Figure 2B:
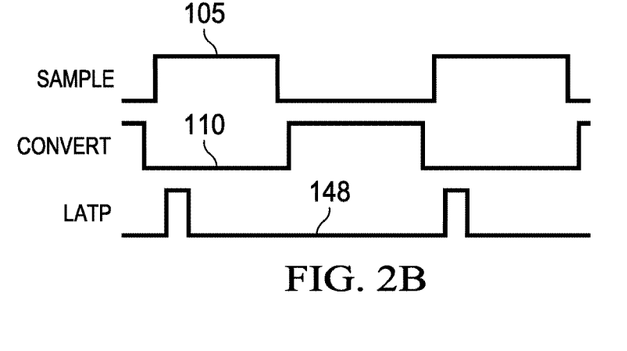
FIG. 2B illustrates a graph of control signals in the reference voltage generator shown in FIG. 2A.

FIG. 2B illustrates a graph of control signals SAMPLE 105, CONVERT 110, and LATP 148 in the reference voltage generator 200 shown in FIG. 2A. Comparator 225 outputs a difference between the reference voltage input VREF_IN 144 and the reference feedback signal REF_FB 195 at a time indicated by the clock input LATP 148. The reference feedback signal REF_FB 195 from the buffer stage 170 represents the output reference voltage REF_OUT 130. The clock input LATP 148 causes the comparator 225 to sample the output reference voltage REF_OUT 130 at a time during the SAMPLE phase at which it is settled at the settled value VREF_SETTLED 120. As such, the comparator 225 outputs a difference BIT between the reference voltage input VREF_IN 144 and the settled value VREF_SETTLED 120 rather than the time average value VREF_AVERAGE 115.

The comparator 225 outputs the difference BIT and an inverse BITZ of the difference BIT. For example, the comparator 225 outputs a difference BIT of logical one and an inverse BITZ of logical zero while the settled value VREF_SETTLED 120 is less than the reference voltage input VREF_IN 144. Conversely, the comparator 225 outputs a difference BIT of logical zero and an inverse BITZ of logical one while the settled value VREF_SETTLED 120 is greater than the reference voltage input VREF_IN 144.

Within the one-bit DAC 255, switches 232 and 238 are closed during a SAMPLE phase of operation. LATP 148 is configured to cause the comparator 225 to output BIT and BITZ during the SAMPLE phase of operation, and switches 234 and 236 open and close based on the values of BIT and BITZ, respectively, coupling one of the supply voltages VDD 198 or VSS 210 to the sampling capacitor Cs 240. The sampling capacitor Cs 240 is charged by VDD 198 or discharged by VSS 210 during the SAMPLE phase of operation.

During the CONVERT phase of operation, switches 232 and 238 are open, uncoupling the supply voltages VDD 198 and VSS 210 from the sampling capacitor Cs 240. Switch 164 in the switched capacitor accumulator 160 is closed, coupling the sampling capacitor Cs 240 to the accumulating capacitor CD 168. Charge from sampling capacitor Cs 240 is transferred to the accumulating capacitor CD 168, adjusting the voltage VSTG1 on the output of the digital feedback loop 140.

The comparator 225 and one-bit DAC 255 act as a transconductor with an output current I 260 that can be represented as:

$$I260 = \left(\frac{(k)(\text{VREF\_IN} - \text{REF\_FB})}{\sigma}\right)(VSTEP)(Cs)(Fs) \tag{1}$$

where σ represents the standard deviation of the comparator noise, k represents a constant associated with the type of noise distribution of the comparator noise, VSTEP represents the voltage step generated by the one-bit DAC 255 and Fs represents the sampling frequency of the ADC. VSTEP is the difference between the supply voltage VDD 198 and VSTG1 on the output of the digital feedback loop 140.

If the value of VSTEP is independent of VSTG1, the direct current (DC) gain of comparator 225 with DAC 255 is very high, resulting in low DC offset. However, since VSTEP depends on VSTG1, the DC gain is reduced (e.g. around 60 dB) thereby reducing DC reference voltage accuracy. The voltage VSTG1 on the output of the digital feedback loop 140 is provided to the buffer stage 170, which outputs the reference voltage REF_OUT 130 and the reference feedback signal REF_FB 195.

Figure 3:
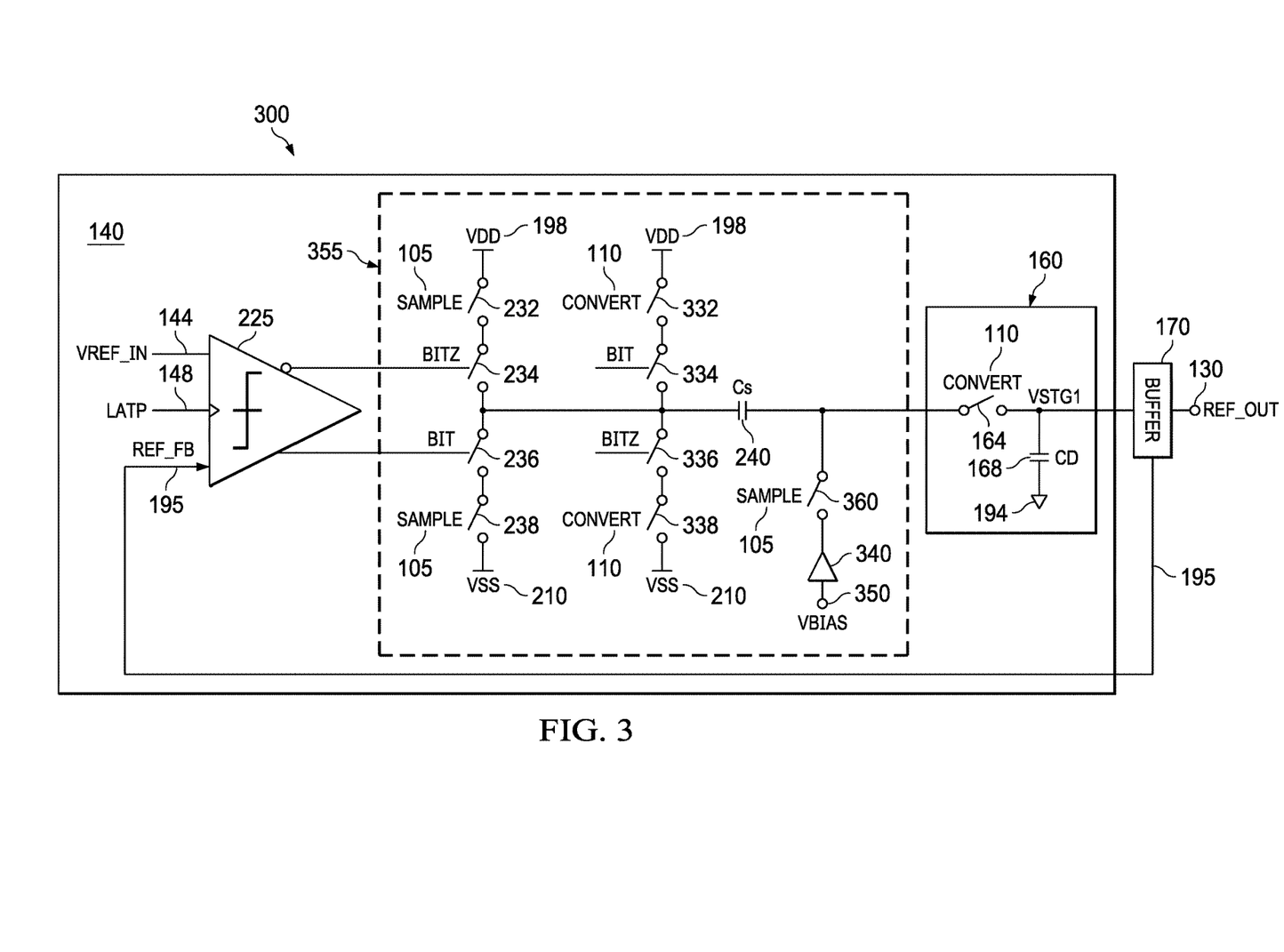
FIG. 3 illustrates a reference voltage generator with a one-bit digital feedback loop and biasing voltages.

FIG. 3 illustrates a reference voltage generator 300 with a digital feedback loop 140 and biasing voltages. Reference voltage generator 300 is similar to reference voltage generator 200 described herein with reference to FIG. 2A. Reference voltage generator 300 includes one-bit DAC 355, which, in some example embodiments, is a low bandwidth, high gain stage that includes switches 332, 334, 336, 338, and 360 and buffer 340 in addition to the switches 232, 234, 236, and 238 and sampling capacitor Cs 240 included in one-bit DAC 255 in reference voltage generator 200.

Switch 332 is coupled to the supply voltage rail configured to receive VDD 198 and controlled by CONVERT 110. Switch 334 is coupled to switch 332 and controlled by the first output BIT of comparator 225. Switch 336 is coupled to switch 334 and controlled by the inverted output BITZ of comparator 225. Switch 338 is coupled to switch 336 and to the supply voltage rail configured to receive VSS 210. Switch 338 is controlled by CONVERT 110. A first terminal of capacitor Cs 240 is coupled between switches 234 and 236 and between switches 334 and 336 and a second terminal of capacitor Cs 240 is coupled to switched capacitor accumulator 160.

One terminal of switch 360 is coupled between Cs 240 and switch 255 and the other terminal of switch 360 is coupled to the output of buffer 340. Switch 360 is controlled by SAMPLE 105. Buffer 340 is configured to receive a biasing voltage VBIAS 350 which is approximately equal to the value of VSTG1 as set by the digital feedback loop 140. During the SAMPLE phase of operation, switches 232, 234, 236, and 238 operate as described herein with reference to FIGS. 2A and 2B. In addition, switch 360 is closed, coupling the biasing voltage VBIAS 350 from buffer 340 to the second terminal of Cs 240.

During the CONVERT phase of operation, switch 360 is open and disconnects the buffer 340 from the second terminal of Cs 240. Switches 332 and 338 are closed. Switches 334 and 336 open and close based on the values of BIT and BITZ, respectively, coupling one of the supply voltages VDD 198 or VSS 210 to the sampling capacitor Cs 240. The sampling capacitor Cs 240 is charged by VDD 198 via switch 332 or discharged by VSS 210 via switch 338 during the SAMPLE phase of operation.

The modifications in one-bit DAC 355 relative to one-bit DAC 255 shown in FIG. 2A bias Cs 240 and make VSTEP independent of VSTG1. The reference voltage generator 300 improves the DC accuracy compared to reference voltage generator 200. Stability of reference voltage generator 300 is improved by keeping the delay of buffer 170 less than the digital delay. That is, the bandwidth of buffer 170 is chosen such that the inverse of the bandwidth is much less than a clock period.

Figure 4:
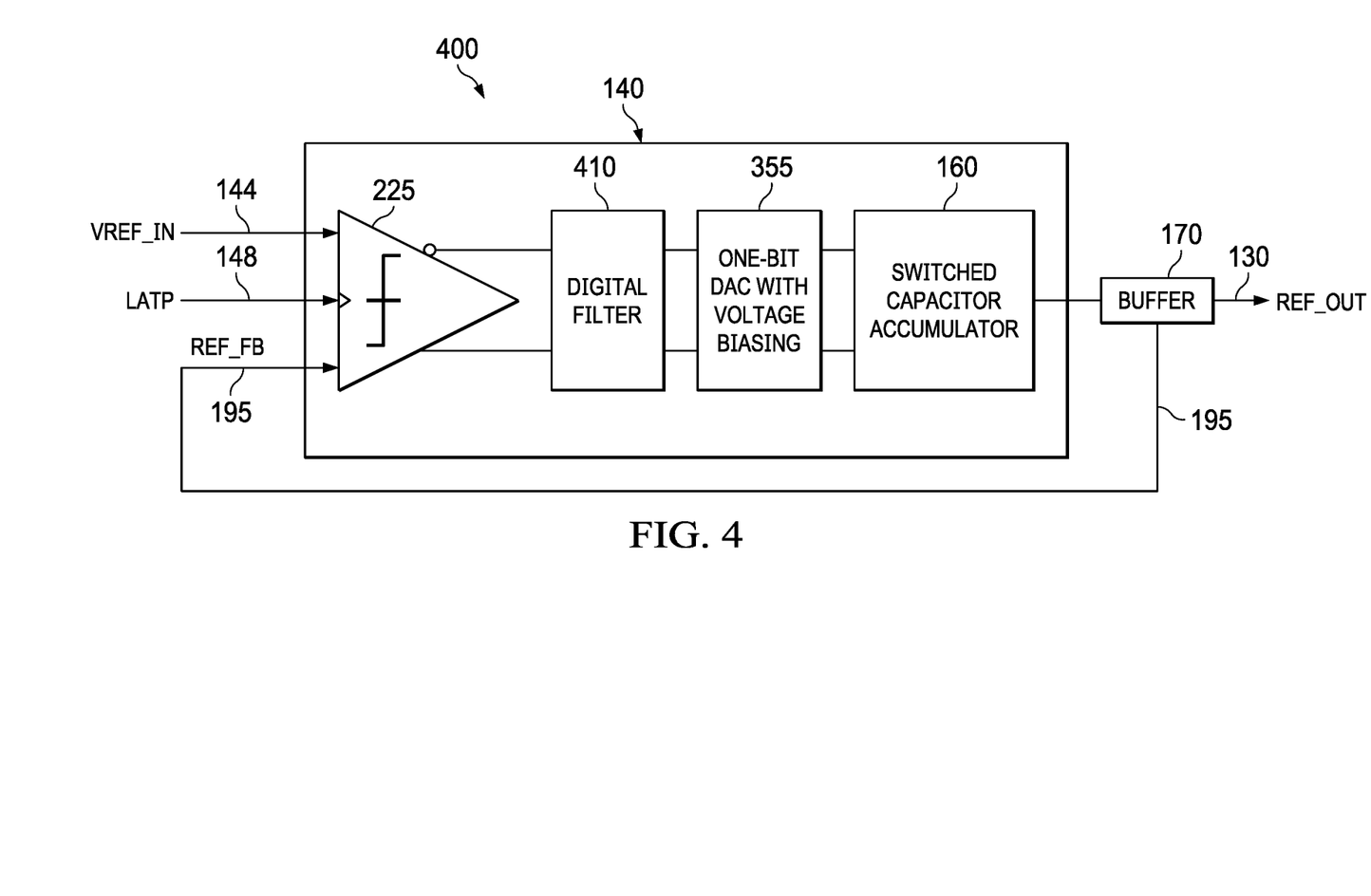
FIG. 4 illustrates a reference voltage generator with a one-bit digital feedback loop, biasing voltages, and a digital filter.

FIG. 4 illustrates a reference voltage generator 400 with a digital feedback loop 140, biasing voltages, and a digital filter. Reference voltage generator 400 is similar to reference voltage generator 300 described herein with reference to FIG. 3 but also includes a digital filter 410 coupled between comparator 225 and one-bit DAC 355 with voltage biasing. Digital filter 410 can bandlimit or low pass filter the one-bit comparator output signal to omit noise frequencies introduced by the comparator 225. Digital filter 410 can be any appropriate digital filter taking into account the comparator noise and the noise requirements of the particular implementation.

For example, the digital filter 410 can be a one-bit accumulator that averages the comparator output signal over a number M of clock cycles, and the filter output toggles the one-bit DAC 355 once in M clock cycles. In another example, the digital filter 410 can be a finite impulse response filter with a number N of taps. Digital filter 410 takes up less area and uses less power than the capacitors used to bandlimit noise in conventional reference buffers with high gain amplifiers and capacitors. In addition, digital filter 410 offers fine control over the noise transfer function and as a result, better filtering.

Figure 5A:
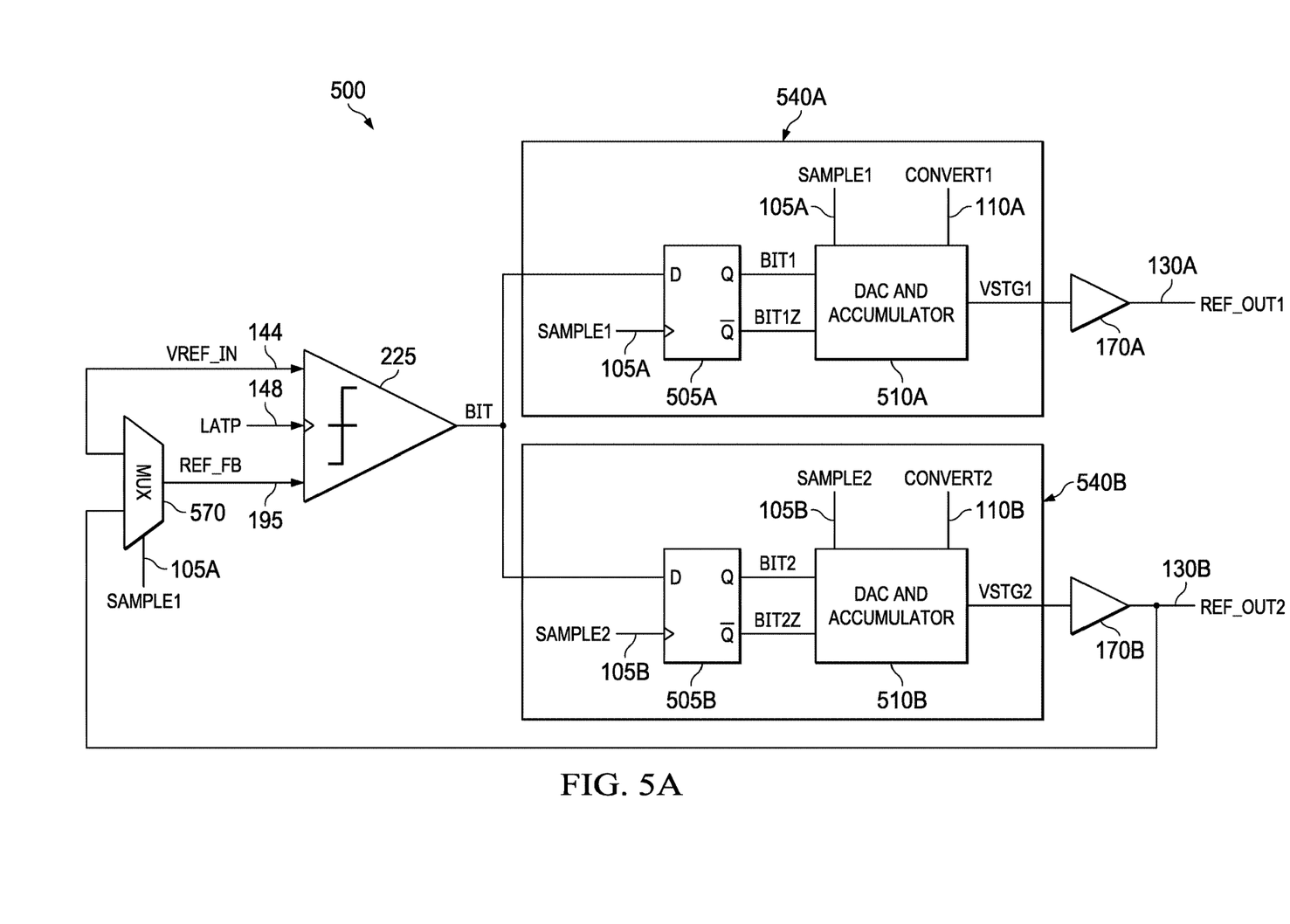
FIG. 5A illustrates a reference voltage generator with a shared comparator for multiple reference voltage outputs.

FIG. 5A illustrates a reference voltage generator 500 with a shared comparator 225 for multiple reference voltage outputs REF_OUT1 130A and REF_OUT2 130B. The output of comparator 225 is coupled to a first signal chain 540A and to a second signal chain 540B. Each of signal chains 540A and 540B includes a D flip-flop 505 as well as a one-bit DAC and switched capacitor accumulator 510 as shown in FIG. 2A. In some implementations, the DAC and accumulators 510 also include voltage biasing as described herein with reference to FIG. 3 and/or digital filters as described herein with reference to FIG. 4. Signal chains 540A and 540B include D flip-flops in this example but any appropriate circuit may be used, such as an SR latch and the like.

In signal chain 540A, D flip-flop 505A receives the difference BIT output from comparator 225 and is controlled by SAMPLE1 105A. D flip-flop 505A outputs BIT1 and BIT1Z to DAC and accumulator 510A, which is controlled by SAMPLE1 105A and CONVERT1 110A. The output of DAC and accumulator 510A is provided to buffer 170A, which outputs REF_OUT1 130A. In signal chain 540B, D flip-flop 505B receives the difference BIT output from comparator 225 and is controlled by SAMPLE2 105B. D flip-flop 505B outputs BIT2 and BIT2Z to DAC and accumulator 510B, which is controlled by SAMPLE2 105B and CONVERT2 110B. The output of DAC and accumulator 510B is provided to buffer 170B, which outputs REF_OUT2 130B.

REF_OUT1 130A and REF_OUT2 130B are provided to the ADC (not shown) and to a multiplexor 570, which selectively outputs REF_OUT1 130A or REF_OUT2 130B based on SAMPLE1 105A. In this example, a multiplexor is used but any appropriate selector logic circuit may be used. The output of multiplexor 570 is the REF_FB 195 provided to comparator 225.

In some ADCs, multiple voltage references may be used (e.g. a coarse reference voltage for initial decisions and a fine reference voltage for final decisions). If multiple references are used, they should be matched, and, therefore, comparator 225 may be shared between the two reference generators. For example, signal chain 540B and buffer 170B can be a coarse reference voltage buffer that is used for the initial CONVERT stage during which the largest capacitors are charged, and the majority of the signal dependent load current is supplied.

Signal chain 540A and buffer 170A can be a fine reference voltage buffer that is used for the final SAR decisions after a dynamic error correction cycle to supply a largely signal-independent current. Any errors introduced by shared comparator 225 are present in both REF_OUT1 130A and REF_OUT2 130B, such that DAC and accumulators 510A and 510B are matched. In this example, only two reference voltage output chains are shown but any appropriate number may be used.

Figure 5B:
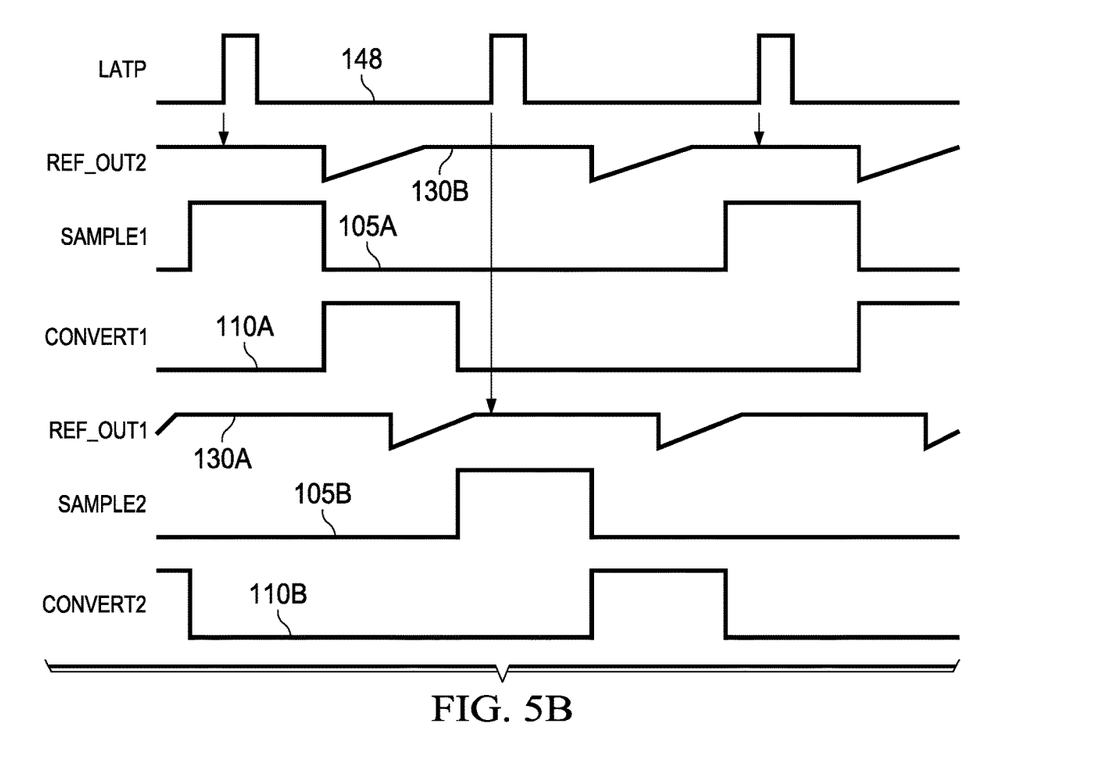
FIG. 5B illustrates a graph of control signals and reference voltage outputs in the reference voltage generator shown in FIG. 5A.

FIG. 5B illustrates a graph of control signals in the reference voltage generator 500 shown in FIG. 5A. SAMPLE1 105A and SAMPLE2 105B are shown here as two unique control signals for ease of explanation. In other implementations, a single control signal SAMPLE 105 is used, and signal chains 540A and 540B operate on alternate SAMPLE phases. Similarly, CONVERT1 110A and CONVERT2 110B are shown here as two unique control signals for ease of illustration. In other implementations, a single control signal CONVERT 110 is used, and signal chains 540A and 540B operate on alternate CONVERT phases. LATP 148 is configured such that the logic high of LATP 148 occurs during the logic highs of SAMPLE1 105A and SAMPLE2 105B, and comparator 225 samples the settled values of REF_OUT1 130A and REF_OUT2 130B output from multiplexor 570.

The multiplexor 570 and comparator 225 can be used to sample REF_OUT1 130A and REF_OUT2 130B on alternate SAMPLE phases and adjust the two reference output chains 540A and 540B independently. For example, in a first CONVERT phase of operation while CONVERT1 110A is logic high and SAMPLE1 105A is logic low, multiplexor 570 outputs REF_OUT1 130A as the feedback signal REF_FB 195. Comparator 225 samples the REF_OUT1 130A based on the trigger signal LATP 148 and adjusts the value of VSTG1 at the output of DAC and accumulator 510A. REF_OUT2 130B is output as a coarse reference voltage. In a second CONVERT phase of operation while CONVERT2 110B is logic high, SAMPLE2 105B is logic low, and SAMPLE1 105A is logic low, multiplexor 570 outputs REF_OUT2 130B as the feedback signal REF_FB 195. Comparator 225 samples the REF_OUT2 130B based on the trigger signal LATP 148 and adjusts the value of VSTG2 at the output of DAC and accumulator 510B. REF_OUT1 130A is output as a fine reference voltage.

Figure 6A:
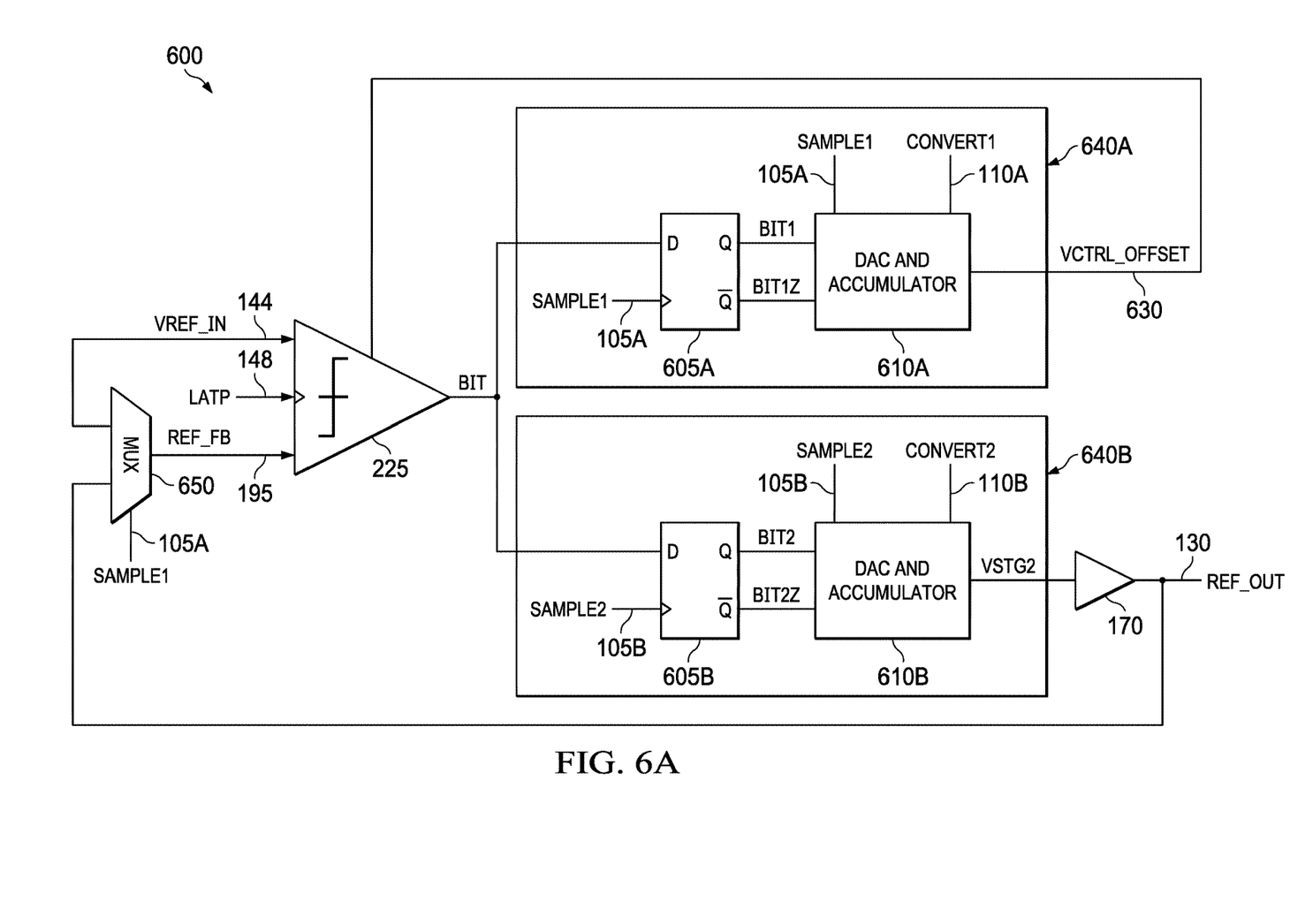
FIG. 6A illustrates a reference voltage generator with autozeroing.
Figure 6B:
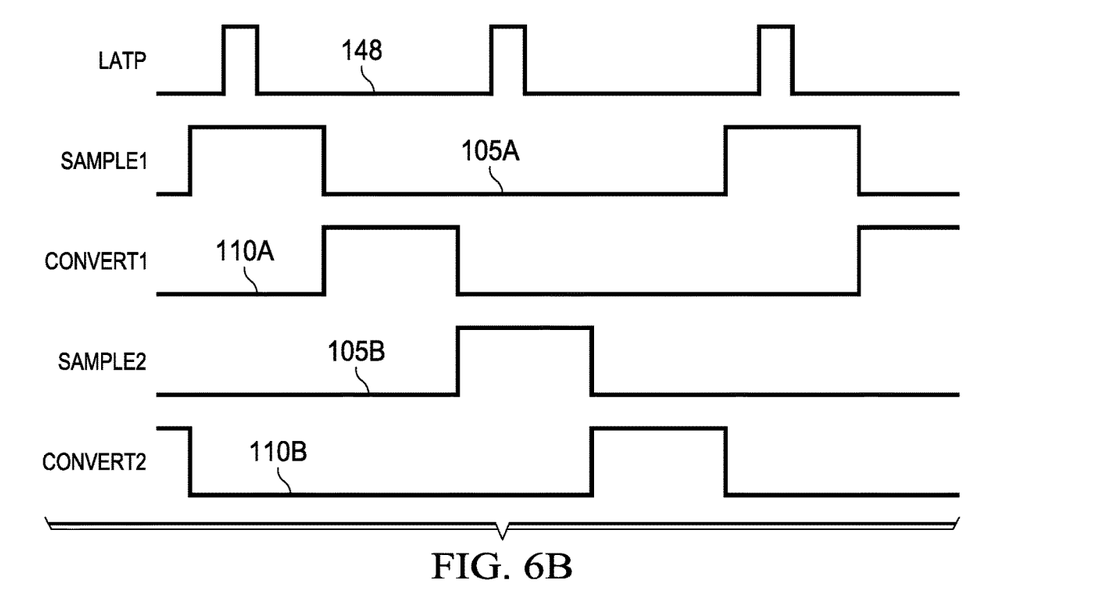
FIG. 6B illustrates a graph of control signals in the reference voltage generator shown in FIG. 6A.

FIG. 6A illustrates a reference voltage generator 600 with autozeroing capabilities. That is, the reference voltage generator 600 is able to compensate for comparator drift due to changes in temperature and the like by shorting the inputs of comparator 225 together and generating a voltage offset VCTRL_OFFSET 630 for comparator 225. Outputs of shared comparator 225 are coupled to a first signal chain 640A and a second signal chain 640B. Each of signal chains 640A and 640B includes a D flip-flop 605 and a DAC and switched capacitor accumulator 610 as shown in FIG. 2A. In some implementations, the DAC and accumulators 610 also include voltage biasing as described herein with reference to FIG. 3 and/or digital filters as described herein with reference to FIG. 4.

Signal chain 640A outputs a control signal VCTRL_OFFSET 630 to comparator 225 to compensate for comparator drift. The output of signal chain 640B is provided to a buffer 170, which outputs the reference voltage REF_OUT 130 to the ADC (not shown) and to a multiplexor 650. Multiplexor 650 selectively outputs REF_OUT 130 or VREF_IN 144 based on SAMPLE1 105A. In this example, a multiplexor is used but any appropriate selector logic circuit may be used. The output of multiplexor 650 is the REF_FB 195 provided to comparator 225. Reference voltage generator 600 operates similarly to the operation of reference voltage generator 500 as described herein with reference to FIG. 5B, but instead of signal chain 540A and buffer 170A outputting REF_OUT 130A, the output of signal chain 640A is provided to comparator 225 as a control signal to compensate for comparator drift.

The comparator 225 can be autozeroed during a SAMPLE phase during which both comparator inputs receive VREF_IN 144 and the signal chain 640A generates the offset correction voltage VCTRL_OFFSET 630. The comparator 225 can be autozeroed in approximately a nanosecond, compared to the microseconds used to autozero analog error amplifiers. Autozeroing of the comparator can reduce phase noise. In addition, the bandwidth of comparator 225 can be dynamically modified or multiple comparator decisions can be made during the autozeroing phase to reduce thermal noise contributions.

In this description, the term "couple" may cover direct and indirect connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

The uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described embodiments, and other embodiments are possible, within the scope of the claims.

What is claimed is:

1. A reference voltage generator, comprising:
   a comparator having a reference voltage input, a feedback input, a control signal input and an output;
   a one-bit digital-to-analog converter (DAC) having an input coupled to the output of the comparator and an output; and
   a switched capacitor accumulator having an input coupled to the output of the one-bit DAC and an output coupled to the feedback input of the comparator.

2. The reference voltage generator of claim 1, wherein the control signal input is a clock input.

3. The reference voltage generator of claim 1, wherein the switched capacitor accumulator comprises:
   a switch coupled to the output of the one-bit DAC and to an output of the reference voltage generator; and
   a capacitor coupled to the output of the reference voltage generator and to ground.

4. The reference voltage generator of claim 1, further comprising a digital filter coupled between the output of the comparator and the input of the one-bit DAC.

5. The reference voltage generator of claim 1, wherein the control signal is a first control signal, and wherein the one-bit DAC comprises:
   a first switch coupled to a first supply voltage rail and having a second control signal input;
   a second switch coupled to the first switch and having an input coupled to the output of the comparator;
   a third switch coupled to the second switch and having an input coupled to an inverted output of the comparator;
   a fourth switch coupled to the third switch and to a second supply voltage rail and having the second control signal input; and
   a sampling capacitor coupled between the second and third switches and to ground.

6. The reference voltage generator of claim 1, wherein the control signal is a first control signal, and wherein the one-bit DAC comprises:
   a first switch and a second switch coupled to a first supply voltage rail, wherein the first switch has a second control signal input, wherein the second switch has a third control signal input;
   a third switch and a fourth switch having inputs coupled to the output of the comparator, wherein the third switch is coupled to the first switch, wherein the fourth switch is coupled to the second switch;
   a fifth switch and a sixth switch having inputs coupled to an inverted output of the comparator, wherein the fifth switch is coupled to the third switch, wherein the sixth switch is coupled to the fourth switch;
   a seventh switch and an eighth switch coupled to a second supply voltage rail, wherein the seventh switch is coupled to the fifth switch and has the second control signal input, wherein the eighth switch is coupled to the sixth switch and has the third control signal input;
   a sampling capacitor coupled between the third and fifth switches and the fourth and sixth switches and to the output of the one-bit DAC;
   a ninth switch coupled to the output of the one-bit DAC and having the second control signal input; and
   a buffer coupled to the ninth switch and having a biasing voltage input.

7. The reference voltage generator of claim 1, wherein the reference voltage generator is coupled to a buffer, wherein the buffer has a reference voltage output for an analog-to-digital converter and the feedback input.

8. An apparatus, comprising:
   a comparator having a reference voltage input, a feedback input, a first control signal input, and an output;
   a first feedback loop coupled to the output of the comparator and having a second control signal input and an output;
   a buffer coupled to the output of the first feedback loop and having an output;
   a selector logic circuit having a first input coupled to the reference voltage input, a second input coupled to the output of the buffer, a third control signal input and an output coupled to the feedback input; and
   a second feedback loop coupled to the output of the comparator and having the third control signal input and an output for an offset correction signal for the comparator.

9. The apparatus of claim 8, wherein the selector logic circuit is configured to output the reference voltage input and the second feedback loop is configured to output the offset correction signal while the second control signal is logic high and the third control signal is logic low.

10. The apparatus of claim 8, wherein each of the first and second feedback loops comprises:
    a one-bit digital-to-analog converter (DAC) coupled to the output of the comparator and having an output; and
    a switched capacitor accumulator coupled to the output of the one-bit DAC.

11. The apparatus of claim 10, wherein at least one of the first and second feedback loops further comprises a digital filter coupled between the output of the comparator and an input of the one-bit DAC.

12. The apparatus of claim 10, wherein the one-bit DAC comprises:
    a first switch coupled to a first supply voltage rail and having the second control signal input;
    a second switch coupled to the first switch and having an input coupled to the output of the comparator;
    a third switch coupled to the second switch and having an input coupled to an inverted output of the comparator;
    a fourth switch coupled to the third switch and to a second supply voltage rail and having the second control signal input; and
    a sampling capacitor coupled between the second and third switches and to ground.

13. The apparatus of claim 10, wherein the one-bit DAC comprises:
    a first switch and a second switch coupled to a first supply voltage rail, wherein the first switch has the second control signal input, wherein the second switch has the third control signal input;
    a third switch and a fourth switch having inputs coupled to the output of the comparator, wherein the third switch is coupled to the first switch, wherein the fourth switch is coupled to the second switch;
    a fifth switch and a sixth switch having inputs coupled to an inverted output of the comparator, wherein the fifth switch is coupled to the third switch, wherein the sixth switch is coupled to the fourth switch;

a seventh switch and an eighth switch coupled to a second supply voltage rail, wherein the seventh switch is coupled to the fifth switch and has the second control signal input, wherein the eighth switch is coupled to the sixth switch and has the third control signal input;

a sampling capacitor coupled between the third and fifth switches and the fourth and sixth switches and to the output of the one-bit DAC;

a ninth switch coupled to the output of the one-bit DAC and having the second control signal input; and a buffer coupled to the ninth switch and having a biasing voltage input.

14. The apparatus of claim 10, wherein the switched capacitor accumulator comprises:

a switch coupled to the output of the one-bit DAC and to an output of the respective one-bit digital feedback loop, wherein the switch has the third control signal input; and a capacitor coupled to the output of the respective one-bit digital feedback loop and to ground.

15. The apparatus of claim 8, wherein an analog-to-digital converter (ADC) comprises the apparatus, and wherein an output of the apparatus is configured to provide a reference voltage to the ADC.

16. The apparatus of claim 15, wherein the ADC is a successive approximation register ADC, and wherein the output of the apparatus is configured to charge at least one capacitor in the ADC.

17. A reference voltage generator, comprising a comparator having a reference voltage input, a feedback input, a first clock input and an output;

a first feedback loop coupled to the output of the comparator and having a second clock input and an output;

a first buffer coupled to the output of the first feedback loop and having a first reference voltage output;

a second feedback loop coupled to the output of the comparator and having a third clock input and an output;

a second buffer coupled to the output of the second feedback loop and having a second reference voltage output; and a selector logic circuit having a first input coupled to the first reference voltage output, a second input coupled to the second reference voltage output, and a control input configured to receive the first clock signal, the selector logic circuit having an output coupled to the feedback input.

18. The reference voltage generator of claim 17, wherein the first feedback loop and the first buffer comprise a coarse reference voltage generator, wherein the second feedback loop and the second buffer comprise a fine reference voltage generator.

19. The reference voltage generator of claim 17, further comprising:

a number N of feedback loops coupled to the output of the comparator, wherein each feedback loop has a unique clock input and an output; and a number N of buffers, wherein each buffer is coupled to the output of a unique feedback loop from the N feedback loops, and wherein each buffer has a unique reference voltage output.

20. The reference voltage generator of claim 19, wherein a frequency of the N unique clock signals is one divided by N.

21. The reference voltage generator of claim 17, wherein the first and second clock signals are inverted relative to each other.

22. The reference voltage generator of claim 17, wherein a frequency of the first and second clock signals is equal to approximately half a frequency of the control signal.

23. The reference voltage generator of claim 17, wherein each of the first and second feedback loops comprises:

a one-bit digital-to-analog converter (DAC) coupled to the output of the comparator and having an output; and a switched capacitor accumulator coupled to the output of the one-bit DAC.

24. The reference voltage generator of claim 23, wherein at least one of the first and second feedback loops further comprises a digital filter coupled between the output of the comparator and an input of the one-bit DAC.

* * * * *